United States Patent
Pellegrin et al.

(10) Patent No.: US 11,475,600 B2
(45) Date of Patent: Oct. 18, 2022

(54) METHOD AND DEVICE FOR DIGITAL DATA COMPRESSION

(71) Applicant: intoPIX s.a., Mont-Saint-Guibert (BE)

(72) Inventors: Pascal Hubert Pellegrin, Wierde (BE); Charles Daniel Buysschaert, Brussels (BE); Gaël Rouvroy, Kraainem (BE)

(73) Assignee: intoPix S.A., Mont-Saint-Guibert (BE)

( * ) Notice: Subject to any disclaimer, the term of this patent is extended or adjusted under 35 U.S.C. 154(b) by 346 days.

(21) Appl. No.: 16/629,145

(22) PCT Filed: Jul. 10, 2018

(86) PCT No.: PCT/EP2018/068716
§ 371 (c)(1),
(2) Date: Jan. 7, 2020

(87) PCT Pub. No.: WO2019/011944
PCT Pub. Date: Jan. 17, 2019

(65) Prior Publication Data
US 2020/0226791 A1    Jul. 16, 2020

(30) Foreign Application Priority Data
Jul. 10, 2017  (EP) .................. 17180619

(51) Int. Cl.
*G06K 9/36* (2006.01)
*G06T 9/00* (2006.01)
(Continued)

(52) U.S. Cl.
CPC .............. *G06T 9/00* (2013.01); *G06T 3/4084* (2013.01); *H04N 19/13* (2014.11);
(Continued)

(58) Field of Classification Search
CPC ......... G06T 9/00; G06T 3/4084; H04N 19/13; H04N 19/124; H04N 19/159; H04N 19/18;
(Continued)

(56) References Cited

U.S. PATENT DOCUMENTS 10,194,219 B2 *  1/2019  Buysschaert .... H04N 21/85406
2014/0247999 A1  9/2014  Pellegrin et al.

FOREIGN PATENT DOCUMENTS

EP          2773122        9/2014
WO     WO-03/092286       11/2003

OTHER PUBLICATIONS

Lorent, J-B. (Mar. 2016). "TICO Lightweight Codec Use in IP Networked or in SDI Infrastructures," retrieved from http://ieeexplore.ieee.org/stampPDF/getPDF.jsp?tp=&arnumber=7470724; 54 pages.
(Continued)

*Primary Examiner* — Duy M Dang
(74) *Attorney, Agent, or Firm* — Finnegan, Henderson, Farabow, Garrett & Dunner, LLP

(57) ABSTRACT

The invention relates to a method for compressing an input data set, wherein the coefficients in the input data set are grouped in groups of coefficients, a number of bit planes, GCLI, needed for representing each group is determined, a quantization is applied, keeping a limited number of bit planes, a prediction mechanism is applied to the GCLIs for obtaining residues, and an entropy encoding of the residues is performed. The entropy-encoded residues, and the bit planes kept allow the decoder to reconstruct the quantized data, at a minimal cost in meta-data.

20 Claims, 6 Drawing Sheets

(51) Int. Cl.
    *H04N 19/13*     (2014.01)
    *H04N 19/159*    (2014.01)
    *H04N 19/182*    (2014.01)
    *H04N 19/64*     (2014.01)
    *G06T 3/40*      (2006.01)

(52) U.S. Cl.
    CPC ......... *H04N 19/159* (2014.11); *H04N 19/182* (2014.11); *H04N 19/647* (2014.11)

(58) Field of Classification Search
    CPC .. H04N 19/182; H04N 19/184; H04N 19/645; H04N 19/647; H03M 7/3075; H03M 7/4075; H03M 7/3071; H03M 7/4037
    See application file for complete search history.

(56) References Cited

OTHER PUBLICATIONS

IntoPIX (Sep. 2016). "intoPIX Codec Submission for JPEG-XS CfP, Design Description V0.1," *73rd ISO/IEC JTC1/SC29/WG1 (JPEG) Meeting*, Oct. 14-21, 2016, Chengdu, China; 46 pages.
International Search Report dated Sep. 5, 2018, in International Application No. PCT/EP2018/068716; 4 pages.
Written Opinion dated Sep. 5, 2018, in International Application No. PCT/EP2018/068716; 9 pages.

* cited by examiner $r_{min} = -4$    $r_{max} = 7$ $r_{min} = -4$    $r_{max} = 7$ $r_{min} = -10$　　　$r_{max} = 3$ $r_{min} = -10$　　　$r_{max} = 3$ Table I

| | | | coefficients | | | | | | | | | | | |
|---|---|---|---|---|---|---|---|---|---|---|---|---|---|---|
| | | | 3 | 250 | 138 | 179 | 53 | 12 | 14 | 90 | 4 | 0 | 5 | 6 |
| MSB | 15 | | 0 | 0 | 0 | 0 | 0 | 0 | 0 | 0 | 0 | 0 | 0 | 0 |
| | 14 | | 0 | 0 | 0 | 0 | 0 | 0 | 0 | 0 | 0 | 0 | 0 | 0 |
| | 13 | | 0 | 0 | 0 | 0 | 0 | 0 | 0 | 0 | 0 | 0 | 0 | 0 |
| | 12 | | 0 | 0 | 0 | 0 | 0 | 0 | 0 | 0 | 0 | 0 | 0 | 0 |
| | 11 | | 0 | 0 | 0 | 0 | 0 | 0 | 0 | 0 | 0 | 0 | 0 | 0 |
| | 10 | | 0 | 0 | 0 | 0 | 0 | 0 | 0 | 0 | 0 | 0 | 0 | 0 |
| | 9 | | 0 | 0 | 0 | 0 | 0 | 0 | 0 | 0 | 0 | 0 | 0 | 0 |
| | 8 | | 0 | 1 | 1 | 1 | 0 | 0 | 0 | 0 | 0 | 0 | 0 | 0 |
| | 7 | | 0 | 1 | 0 | 0 | 0 | 0 | 0 | 1 | 0 | 0 | 0 | 0 |
| | 6 | | 0 | 1 | 0 | 1 | 1 | 0 | 0 | 0 | 0 | 0 | 0 | 0 |
| | 5 | | 0 | 1 | 0 | 1 | 1 | 0 | 0 | 1 | 0 | 0 | 0 | 0 |
| ↑ quantization level t | 4 | | 0 | 1 | 1 | 0 | 0 | 1 | 1 | 1 | 0 | 0 | 0 | 0 |
| | 3 | | 0 | 0 | 0 | 0 | 1 | 1 | 1 | 0 | 1 | 0 | 1 | 1 |
| | 2 | | 1 | 1 | 1 | 1 | 0 | 0 | 1 | 1 | 0 | 0 | 0 | 1 |
| LSB | 1 | | 1 | 0 | 0 | 1 | 1 | 0 | 0 | 0 | 0 | 0 | 1 | 0 |
| | GCLI | | 8 | | | | 7 | | | | 3 | | | |

FIG. 10

METHOD AND DEVICE FOR DIGITAL DATA COMPRESSION

CROSS-REFERENCE TO RELATED PATENT APPLICATIONS

This is a U.S. national stage application, which claims the benefit of International Application No. PCT/EP2018/068716, filed Jul. 10, 2018, which claims the benefit of European Application No. 17180619.3, filed Jul. 10, 2017, each of which is hereby incorporated by reference in its entirety.

FIELD OF THE INVENTION

The invention relates to a method for compressing an input data set comprising a sequence of coefficients into a compressed data set and to a method for decompressing said compressed data set. The invention also relates to a compressed data set and to a device for performing this compression method and a device for performing said decompression method.

DESCRIPTION OF PRIOR ART

Data compression is required when one needs to transmit or store data that would require a larger bitrate or size than the available bandwidth of the communication channel or the capacity of the storage medium. This is possible when the data contain a significant amount of redundancy, and some amount of details that could be removed without compromising the purpose of the transmission. The compression is said to be lossless when the data are not modified by the compression-decompression cycle, and thus are identical at the emitter and the receiver. However, it is usually not possible to guarantee a lossless compression since it depends on the intrinsic characteristics of the data, in which the redundancy and the ability to remove it by a clever encoding alone may not always succeed in reducing the bitrate or data cost enough. In such case, a lossy compression scheme is required, and the encoder reduces the information contained in the data by quantization, in order to guarantee a required compressed data set size at the expense of quality.

Document SMPTE Registered Disclosure Document SMPTE RDD 35:2016, 24 Mar. 2016, pages 1-53, XP055366991, describes the TICO video compression scheme bitstream, the decoding process and the provisions for mapping bitstreams onto an IP network. In this process, residues are obtained and coded using unary encoding.

Document WO03/092286 describes an adaptive method and system for mapping parameter values to codeword indexes. This method requires the step of sorting the differences or parameters into at least a first group and a second group. This requires additional buffering and processing at the encoder and at the decoder. This also adds latency to the process.

Document EP2773122A1, also related to the TICO video compression scheme, describes a method and device for lossless data compression wherein one groups said data into groups of n words of m bits; one detects for each group the value of the Greatest Coded Line Index (GCLI), the GCLI being the index of the highest weight non-zero bit among the bits of the words in a group; one produces for each group an output data set comprising the GCLI bits of lowest weight of the words of the group, and meta-data comprising the value of the GCLI. This method is very simple in implementation, and is very efficient, especially in the case when many of the data have small values. The values of the GCLIs are comprised between zero, when all words of a group are zero, and m, when at least one word in the group has a bit of weight m equal to 1. Therefore, binary coding of the GCLIs requires $\lceil Log_2(m) \rceil$ bits, $\lceil x \rceil$ being the smallest integer greater than x. This document also proposes an improvement wherein one replaces the GCLI in the output data set by the difference between the GCLI value and a predicted value of the GCLI. In doing so, the values to be coded are smaller, and a unary coding may require less space than binary coding of the GCLIs. However, it appeared that even when using said improvement, the coding of the GCLIs could represent a significant volume in the compressed data set, especially when many of the coefficients become zero. In addition, this document does not address the need of quantization, when the compressed data set size exceeds a data budget, and lossy compression must be performed. Therefore, there is a need for a method for compressing an input data set which is simple to implement, requires less space for coding the meta-data containing the GCLIs, and addresses the issue of quantization.

SUMMARY OF THE INVENTION

It is an object of the present invention to solve the above-mentioned problems. In particular, it is an object of the present invention to provide a compression and decompression method and device having a low complexity, wherein the data budget required for the meta-data is reduced.

The invention is defined by the independent claims. The dependent claims define advantageous embodiments.

According to a first aspect of the invention, there is provided a method for compressing, according to compression parameters, one or more input data sets, the or each input data set comprising a sequence of M coefficients, each coefficient having m bits coding a magnitude comprised between 0 and $2^m-1$, into one or more corresponding compressed data sets each comprising a magnitude compressed data set, and a meta-data compressed data set, wherein said compression parameters may comprise M, m, n, t, the type of quantization, the mapping mode, being either negative-first or positive-first; the number of rows and columns of a display image, if the input data set represents a display image; a number of rows of a subband, if the sequence of pixels is a decorrelative transform of a display image; the prediction mode, which may be horizontal or vertical prediction; the way the initial values of the predictors are determined; the entropy coding mode; the value of the parameter k of the Rice coding if the entropy coding is a Rice coding and the bounding mode, comprising the steps of, for the or each input data set:

A. grouping the coefficients into one or more successive groups of n coefficients, grouping factor n being greater than or equal to 2, each group of coefficients having m magnitude bit planes for the different weights of the coefficients;

B. for each group i of coefficients,
   a) determining a value of the Greatest Coded Line Index (GCLI), the $GCLI_i$ being the index of the highest weight non-zero bit among the bits of the magnitude of the coefficients in said group i, the index being counted from 1 for the least significant bit to m for the most significant bit, the GCLI being zero for a group wherein all of the coefficients are equal to zero;

b) performing a quantization such that quantized coefficients are comprised in the range 0 to $2^{(m-t)}-1$, providing n quantized coefficients, t being a quantization level;

c) if $GCLI_i \geq t+1$, for each bit plane of said group, copying bit planes having weight 1 to weight $GCLI_i-t$ of the quantized coefficients to the magnitude compressed data set;

d) if $GCLI_i \leq t$, do nothing e) computing a predictor $pred_i$ of $GCLI_i$, in function of the GCLIs of one or more groups of antecedent coefficients in said sequence of coefficients, the predictor $pred_i$ being equal to pred_init, for the first group of coefficients of said sequence of coefficients;

f) computing a residue $r_i$ $$r_i = \max(GCLI_i - t, 0) - \max(pred_i - t, 0);$$

g) mapping the residue $r_i$ to a code, said mapping being obtainable by performing the steps of
  (1) computing the $r_{min}$, the smallest value of the residues for all possible values of $GCLI_i$, being $$r_{min} = -\max(pred_i - t, 0);$$

(2) computing the $r_{max}$, the largest value of the residues for all possible values of $GCLI_i$, being $$r_{max} = \max(m - \max(pred_i, t), 0);$$

(3) computing $C_{first} = -1$ if negative-first mapping mode, +1 if positive-first mapping mode;
  (4) computing trigger=$|r_{min}|$ if bounding mode is "bounded by min";

trigger=$\text{MIN}(|r_{min}|, r_{max})$ if bounding mode is "bounded by min/max";

trigger=$r_{max}$ if bounding mode is "bounded by max";

trigger=$m$ if bounding mode is "not bounded";

(5) IF $|r_i| \leq$ trigger THEN
      IF $r_i * C_{first} > 0$ THEN
      $C = 2 * |r_i| - 1$
      ELSE $C = 2 * |r_i|$
      ELSE $C = $ trigger$+|r_i|$ h) providing an entropy encoding of the code C, and copying said encoding into the meta-data compressed data set.

Preferably, said entropy encoding is a Rice coding, with k=0, 1 or 2. More preferably, k=0.

Preferably n is smaller than or equal to 8 or is equal to 4.

Said quantization may advantageously be performed by removing the t lowest bit planes of the groups of coefficients.

Said input data set may be obtained by performing a decorrelative transform on a non-decorrelated input data set.

Said sequence of M coefficients may correspond to a sequence of pixels of one or more rows of a display image comprising rows and columns of pixels or one or more rows of a subband of a decorrelative transform of a display image comprising rows and columns of pixels.

According to an embodiment of the invention with horizontal prediction, in step B.e), said predictor $pred_i$ of $GCLI_i$ is the GCLI of the previous groups of coefficients in a sequence of coefficients, being pred_init for the first group of coefficients in a sequence of coefficients.

According to an embodiment of the invention with vertical prediction, in step B.e), said predictor $pred_i$ of $GCLI_i$ is the GCLI of the group of pixels in same column of previous row of pixels if said GCLI is larger than t, and zero if said GCLI is smaller than or equal to t, being pred_init for the groups of pixels of the first row of pixels.

In a preferred embodiment of the compression method of the invention with vertical prediction, said one or more input data sets comprising at least two input data sets, a first input data set having a quantization level $t_1$, a second input data set having a quantization level $t_2$, the last row of pixels of the first input data set being above the first row of pixels of the second input data set, in a display image, the predictor for a group of pixels of the first row of pixels of the second input data set is equal to the GCLI of the group of pixels of the last row of pixels in the same column of the first input data set if said GCLI>t1 and equal to zero if said GCLI≤t1.

According to a second aspect of the invention, there is provided a method for decompressing, according to compression parameters, one or more compressed data sets each comprising a meta-data compressed data set comprising a sequence of entropy encoded codes $c_i$ and a magnitude compressed data set comprising bit planes of coefficients, obtainable by a method of the first aspect of the invention, with same compression parameters, into one or more corresponding decompressed data sets each comprising a sequence of coefficients, each coefficient having m bits coding a magnitude comprising the step of:

a) initializing a predictor $pred_i'$ to pred_init;
   if the prediction mode is vertical, then initializing a row of GCLIs $prev_i$ to pred_init;

b) extracting a code $c_i$ from said meta-data compressed data set;

c) if the prediction mode is vertical, then computing $$pred_i' = prev_i;$$

d) obtaining the residue $r_i$ corresponding to said code $c_i$, the correspondence being obtainable by performing the steps of
   (1) performing steps B.g) of first aspect of the invention, for all values of r comprised between $r_{min}$ and $r_{max}$, providing a table;
   (2) obtaining the residue $r_i$ corresponding said code $ci_i$ from said table;

e) computing the number of bit planes $n_{bp}$ stored for the group corresponding to said code, said number of bit planes being $$n_{bp} = r_i + pred_i';$$

f) if said number of bit planes $n_{bp}$ equals zero, providing a sequence of n m-bit words having all bit planes from t+1 to m at zero in the decompressed data set;

g) if said number of bit planes $n_{bp}$ is different from zero, providing a sequence of n m-bit words having the t+1 to $t+n_{bp}$ bit planes extracted from subsequent n-bit bit planes from the magnitude compressed data set and having the t+1+nbp to m bit planes equal to zero;

h) if the prediction mode is horizontal, then replacing $pred_i'$ by $n_{bp}$; if the prediction mode is vertical, then replacing $prev_i = n_{bp}$;

i) repeating steps b) to g) for successive codes and bit planes until all codes in the meta-data compressed data set have been used.

In step d), the residue $r_i$ may be performed by actually performing steps d(1) and d(2) or by other equivalent methods such as a searching algorithm or a formula.

When compression has been performed according to said preferred embodiment of the invention with vertical prediction, in the method for decompressing these two or more input data sets, for the first row of the second data set, one may advantageously take as predictor $\text{pred}_i'$, the corresponding value of $\text{prev}_i$ obtained for the last row of the first data set.

In the compression method and int the decompression method of the invention, pred_init may be equal to zero or equal to int(m/2).

According to a third aspect of the invention, there is provided a compressed data set corresponding to an uncompressed data set, said uncompressed data set comprising a sequence of M coefficients, each coefficient having m bits coding a magnitude, said compressed data set being obtainable from said uncompressed data set by the compression method of the invention, comprising
  a meta-data compressed data set comprising a sequence of entropy-encoded codes and
  a magnitude compressed data set comprising bit planes of coefficients.

According to a fourth aspect of the invention, there is provided a device for compressing an input data set comprising a sequence of M coefficients, each coefficient having m bits coding a magnitude into an compressed data set comprising a magnitude compressed data set, a meta-data compressed data set, comprising at least one of a logic circuit, an ASIC, an FPGA, a GPU and a CPU, configured for performing the steps of the compression method of the invention.

According to a fifth aspect of the invention, there is provided a device for decompressing a compressed data set having data representing compression parameters, said compression parameters comprising the values of M, m, n, t, the type of quantization, the mapping mode, being either negative-first of positive-first, the type of entropy encoding and the prediction mode, and comprising a meta-data compressed data set comprising a sequence of Rice-coded codes and a magnitude compressed data set comprising bit planes of coefficients, into a decompressed data set comprising a sequence of coefficients, each coefficient having m bits coding a magnitude, said compressed data set being obtainable by the compression method of the invention, into an decompressed data set, said decompressed data set comprising a sequence of M coefficients, each coefficient having m bits coding a magnitude, comprising at least one of a logic circuit, an ASIC, an FPGA, a GPU and a CPU, configured for performing the steps of the decompression method of the invention.

SHORT DESCRIPTION OF THE DRAWINGS

FIG. 10 contains Table I that is an example of a sequence of M=12 coefficients, each coefficient having m=15 magnitude bits, grouped in three groups of n=4 coefficients.

The drawings of the figures are neither drawn to scale nor proportioned.

DETAILED DESCRIPTION OF EMBODIMENTS OF THE INVENTION

Figure 1:
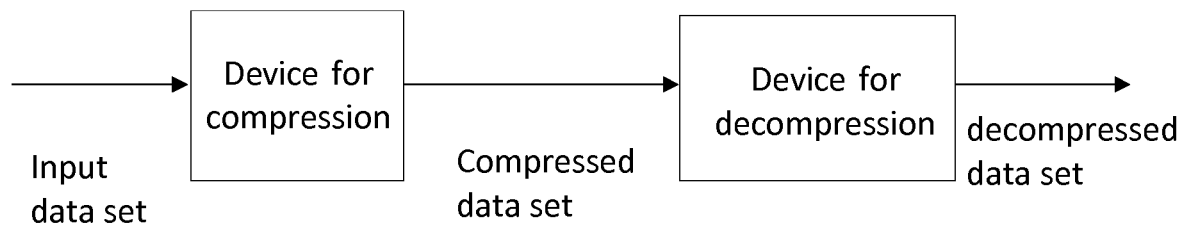
FIG. 1 is a schematic representation of the data flow between a device for compression and a device for decompression of the invention.

FIG. 1 is a schematic representation of the data flow between a device for compression and a device for decompression of the invention. The input dataset may comprise a sequence of M coefficients, each having m bits coding a magnitude. The input data set may represent a display image having a number of rows and columns, or a transformation of a display image, such as sub-bands of a wavelet transform of an image. The device for compression processes the input data set and produces a compressed data set. The compressed data set may comprise a magnitude compressed data set and a meta-data compressed data set. In addition, the device for compressing may produce a set of compression parameters. These compression parameters may comprise:
  M, the number of coefficients in the input data set;
  m, the number of bits in the magnitude of the coefficients of the input data set;
  n, the grouping factor;
  t, the quantization level;
  the type of quantization;
  the mapping mode, being either negative-first or positive-first;
  the number of rows and columns of a display image, if the input data set represents a display image;
  the number of rows, and the subband, if the sequence of pixels is a decorrelative transform of a display image;
  the prediction mode, which may be horizontal or vertical prediction;
  the initial predictor pred_init, used when no antecedent GCLI is available for determining a predictor;
  the way the initial values of the predictors are determined;
  the entropy coding mode;
  the value of the parameter k of the Rice coding if the entropy coding is a Rice coding; and
  the bounding mode, being one of
    bounded by min;
    bounded by min/max;
    bounded by max;
    not bounded.

These compression parameters are used by the device for compression and by the device for decompression. Some of these parameters may be communicated from the compression device to the decompression device, or be fixed and agreed upon beforehand between the compression and the decompression device. The device for decompression produces a decompressed data set similar to the input data set, but with some loss of quality due to the quantization.

Table I shown in FIG. 10 is an example of a sequence of M=12 coefficients, each coefficient having m=15 magnitude bits, grouped in three groups of n=4 coefficients. For each group, the GCLI is represented, the GCLI being the Greatest Coded Line Index, i.e. the index of the highest weight non-zero bit among the bits of the magnitude of the coefficients in said group. A simple quantization, is represented, where the t=4 lowest bit planes of the coefficients are truncated, i.e. the quantization level t is 4.

The GCLIs of the three successive groups are 8, 7 and 3. If one uses a prediction method and replaces the GCLIs by a residue, given by equation 1

$$r_i = GCLI_i - pred_i \quad \text{(equ. 1),}$$

one obtains smaller values to be coded. In addition, when a quantization is performed, the residue n needed by the decompression device for decoding the data may be computed as $$r_i = \max(GCLI_i - t, 0) - \max(pred_i - t, 0) \quad \text{(equ. 2)}$$

The residue n according to equation 2 provides the necessary information to the decoder, while keeping the values to be coded as small as possible. Assuming that the predictor is taken as the previous GCLI in the sequence, (horizontal prediction) and that the GCLI of the group preceding the first one of the example is 7, the residues n are as follows:

TABLE II

| GCLI | 8 | 7 | 3 |
|---|---|---|---|
| $pred_i$ | 7 | 8 | 7 |
| $r_i$ | 1 | -1 | -3 |
| $n_{bp}$ | 4 | 3 | 0 |

As can be seen in this example, the residues n are smaller values. The number of bit planes to be transmitted, $n_{bp}$ i.e. the number of bit planes above the dashed line in table I is equal to GCLI-t when GCLI>t and equal to zero if GCLI≤t.

Table III is an example showing the treatment of a sequence of coefficients grouped in seven groups producing seven GCLIs. The quantization level t is 6. At the encoder, an initial predictor for the first group is taken as pred_init=0. The subsequent predictors are taken as the GCLI of the previous group in the sequence $GCLI_{i-1}$. This prediction mode applies in the general case, and when the input data set represents an image and horizontal prediction mode is used. The residues n are computed according to equation 2. The $n_{bp}$ bit planes are copied from the quantized coefficients to the magnitude compressed data set. The sequence of residues and bit planes are provided to the decoder.

At the decoder, the initial predictor for the first group is taken in the same way as at the encoder (in the example, predi_init=0). The number of bit planes $n_{bp}$ is computed using equation 3.

$$n_{bp} = r_i + pred_i' \quad \text{(equ. 3)}$$

The predictor for the subsequent group is taken as the $n_{bp}$ of the current group, which corresponds to the GCLI of the quantized coefficients. The GCLI' of the decompressed data set coefficients may be obtained by adding t to the $n_{bp}$ values when they are not null, and keeping a zero value when they are null. As one can see these GCLI's are equal to the GCLIs if the input data set, if the GCLI of the input data set is larger than t, and are equal to zero if the GCLI≤t, since in that case all the coefficients bitplanes have been removed, yielding null coefficients at the decoder.

TABLE III

| t = 6 | | | | | | | |
|---|---|---|---|---|---|---|---|
| at encoder | | | | | | | |
| i | 1 | 2 | 3 | 4 | 5 | 6 | 7 |
| $GCLI_i$ | 7 | 4 | 5 | 10 | 8 | 9 | 6 |
| $pred_i$ | 0 | 7 | 4 | 5 | 10 | 8 | 9 |
| $r_i$ | 1 | -1 | 0 | 4 | -2 | 1 | -3 |
| $n_{bp}$ | 1 | 0 | 0 | 4 | 2 | 3 | 0 |
| at decoder | | | | | | | |
| $r_i$ | 1 | -1 | 0 | 4 | -2 | 1 | -3 |
| $pred_i'$ | 0 | 1 | 0 | 0 | 4 | 2 | 3 |
| $n_{bp, i}$ | 1 | 0 | 0 | 4 | 2 | 3 | 0 |
| $GCLI_i'$ | 7 | 0 | 0 | 10 | 8 | 9 | 0 |

When the input data set corresponds to a sequence of pixels of one or more rows of a display image comprising rows and columns of pixels or one or more rows of a subband of a decorrelative transform of a display image comprising rows and columns of pixels, vertical prediction is possible. It has been observed that vertical prediction gives good results.

Table IV shows an example similar to the example of table III, but applying vertical prediction. Row I of GCLIs is processed, taking into account previous row I-1. The predictor $pred_i$ is determined as follows:

IF $GCLI_i(I-1) \leq t$ THEN $pred_i = 0$ ELSE $pred_i = GCLI_i(I-1)$

The residues are computed according to equation 2.
At the decoder, the set of GCLI's corresponding to the quantized coefficients of the previous row (row I-1) are kept in a buffer for use in processing row I. The predictor $pred_i'$ is computed with $$pred_i' = GCLI_i'(I-1) \quad \text{(equ. 4)}$$

and the number of bit planes is computed according to equation 3. The GCLI's for the current row are equal to the number of bit planes $n_{bp,i}$ and stored for use by the subsequent row. For the first row of a data set, a row initialized to values pred_init is used.

TABLE IV

| t = 6 | | | | | | | |
|---|---|---|---|---|---|---|---|
| at encoder | | | | | | | |
| i | 1 | 2 | 3 | 4 | 5 | 6 | 7 |
| $GCLI_i(I-1)$ | 5 | 3 | 7 | 13 | 12 | 9 | 8 |
| $GCLI_i(I)$ | 7 | 4 | 5 | 10 | 8 | 9 | 6 |
| $pred_i$ | 0 | 0 | 7 | 13 | 12 | 9 | 8 |
| $r_i$ | 1 | 0 | -1 | -3 | -4 | 0 | -2 |
| $n_{bp, i}$ | 1 | 0 | 0 | 4 | 2 | 3 | 0 |
| at decoder | | | | | | | |
| $GCLI_i'(I-1)$ | 0 | 0 | 1 | 7 | 6 | 3 | 2 |
| $r_i$ | 1 | 0 | -1 | -3 | -4 | 0 | -2 |
| $pred_i'$ | 0 | 0 | 1 | 7 | 6 | 3 | 2 |
| $n_{bp, i}$ | 1 | 0 | 0 | 4 | 2 | 3 | 0 |
| $GCLI_i'(I)$ | 1 | 0 | 0 | 4 | 2 | 3 | 0 |

Figure 2:
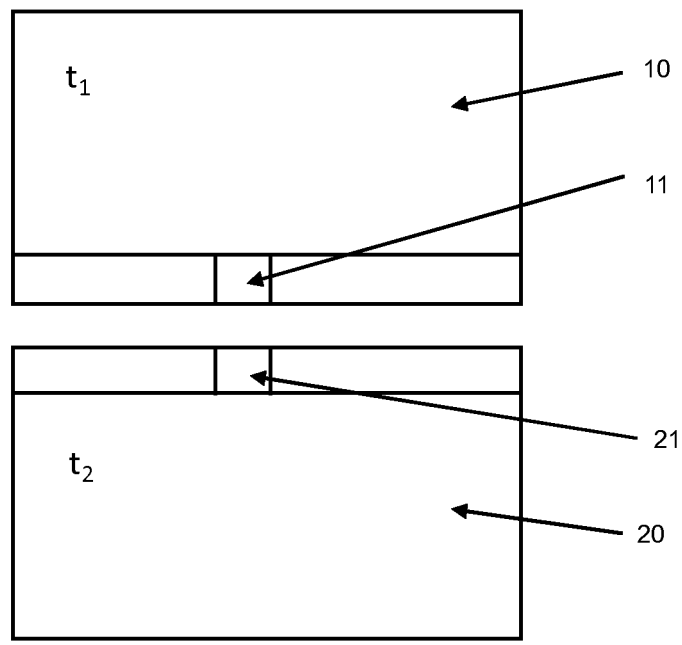
FIG. 2 is a represents schematically two input data sets and how the vertical prediction is performed at the boundary of the two data sets. the residue in function of the GCLI, without quantization.

When the input data represents images and comprises two or more input data sets, and when the last row of a first data set is immediately above the first row of a second data set, these two data sets may be processed independently, with the initializations of the predictors for the first rows as discussed in the previous paragraph. However, in a preferred embodiment of the invention, the last row of the first data set may be used as predictor for the first row of the second data set. A special situation occurs when the quantization level $t_1$ of the first data set is different from the quantization level $t_2$ of the second data set. FIG. 2 represents a situation where a first data set is quantized with a quantization level $t_1$. The last row of the first data set (row I-1) comprises a group 11 having a GCLI $g_1$. The second data set 20 comprises a first row (row I) having a GCLI $g_2$, immediately below the group of $g_1$.

Table V is an example where the first data set has a quantization level $t_1=10$, the second data set has a quantization level $t_2=6$.

The differences with respect to the case of Table IV is that at the encoder, the predictor is determined as follows:

IF GCLI$_i$(I-1)≤$t_1$ THEN pred$_i$=0 ELSE pred$_i$=
  GCLI$_i$(I-1)    (equ. 5)

where $t_1$ is used instead of t. At the decoder, the predictor is taken from the prev$_i$ element of the last row of first data set.

TABLE V

| | | | t = 6 | | | | |
|---|---|---|---|---|---|---|---|
| | | | at encoder | | | | |
| i | 1 | 2 | 3 | 4 | 5 | 6 | 7 |
| GCLI$_i$(I-1) | 5 | 3 | 7 | 13 | 12 | 9 | 8 |
| GCLI$_i$(I) | 7 | 4 | 5 | 10 | 8 | 9 | 6 |
| pred$_i$ | 0 | 0 | 7 | 13 | 12 | 9 | 8 |
| r$_i$ | 1 | 0 | -1 | -3 | -4 | 0 | -2 |
| n$_{bp, i}$ | 1 | 0 | 0 | 4 | 2 | 3 | 0 |
| | | | at decoder | | | | |
| GCLI$_i$'(I-1) | 0 | 0 | 1 | 7 | 6 | 3 | 2 |
| r$_i$ | 1 | 0 | -1 | -3 | -4 | 0 | -2 |
| pred$_i$' | 0 | 0 | 1 | 7 | 6 | 3 | 2 |
| n$_{bp, i}$ | 1 | 0 | 0 | 4 | 2 | 3 | 0 |
| GCLI$_i$'(I) | 1 | 0 | 0 | 4 | 2 | 3 | 0 |

Figure 3:
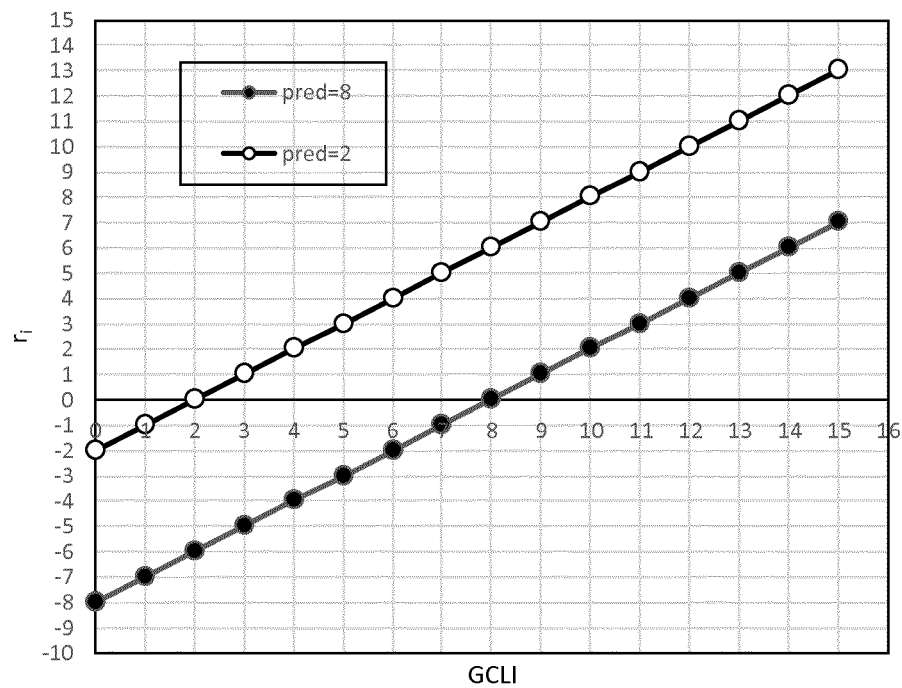
FIG. 3 is a graph representing the residue in function of the GCLI, without quantization.

FIG. 3 is a graph representing the residue in function of the GCLI, given by equation 1, without quantization, for two values of the predictor pred=2 and pred=8. The number of possible values of the residue is equal to the number of values of the GCLI. If the predictor is a good predictor, the residue is near or equal to zero.

Figure 4:
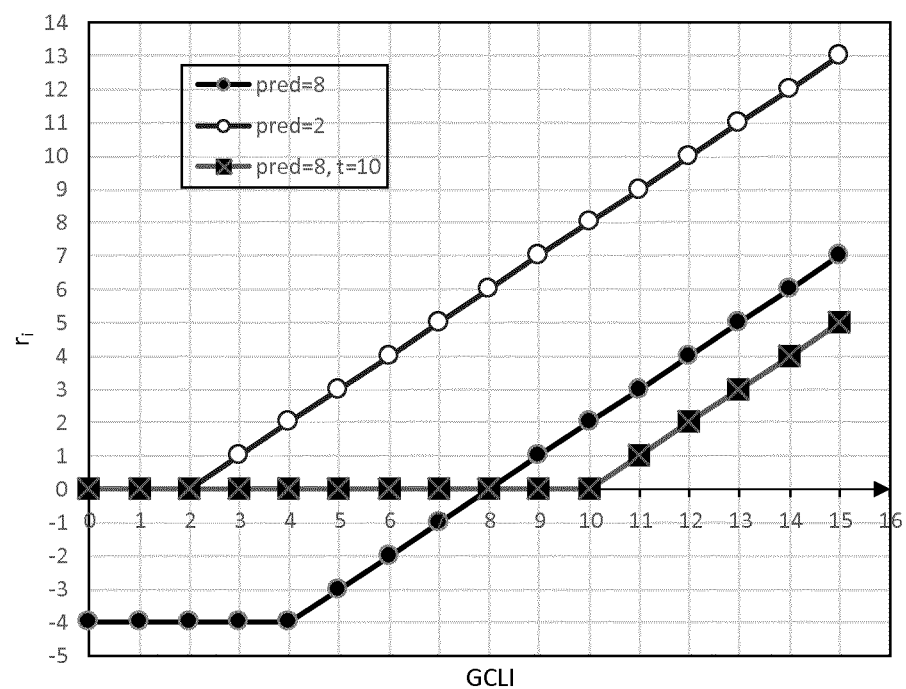
FIG. 4 is a graph representing the residue in function of the GCLI, with quantization.

FIG. 4 is a graph representing the residue in function of the possible values of GCLI between 0 and 15 (or, more generally, m), with quantization, the quantization level t being equal to 4, as given by equation 2. For pred=8, the residue has a lower bound $r_{min}$ equal to -4. For pred=2, the residue has a lower bound $r_{min}$ equal to 0. The upper bounds $r_{max}$ are the same as the ones on FIG. 3, $r_{max}=13$. A graph for the case t=1, pred=8 has also been represented. The lowed bound $r_{min}$ is zero and the upper bound $r_{max}$ is 5. The general expressions of the lower bounds $r_{min}$ and upper bounds $r_{max}$ of the residues are given by equations $r_{min}=-\max(\text{pred}_i-t,0)$    (equ. 6)

and $r_{max}=\max(m-\max(\text{pred}_i,t),0)$    (equ. 7)

The range of values of the residues after quantization, is reduced with respect to the range of values without quantization.

Figure 5:
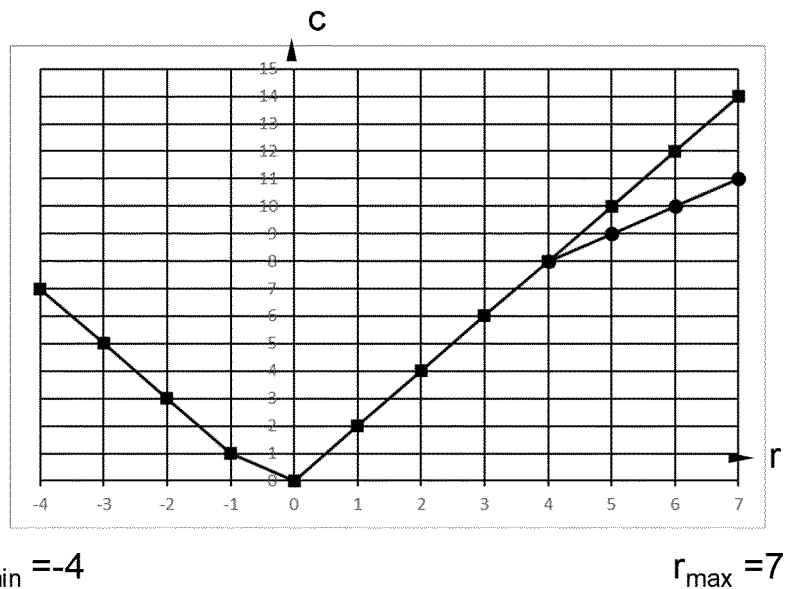
FIGS. 5 and 6 are graphs representing the mapping between the residues and the code, starting by mapping a negative value first and a positive value first, respectively, in a case where $|r_{min}|$ is smaller than $r_{max}$.
Figure 6:
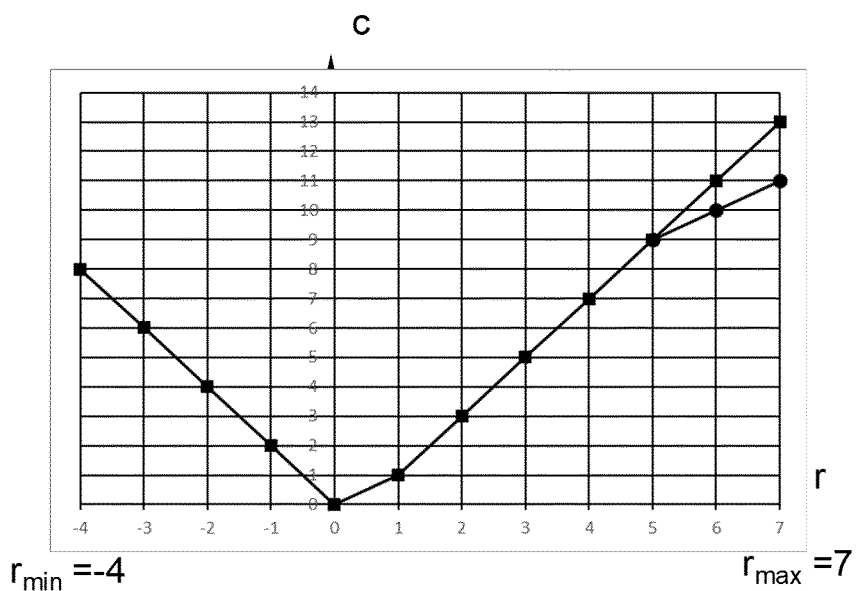
Figure 7:
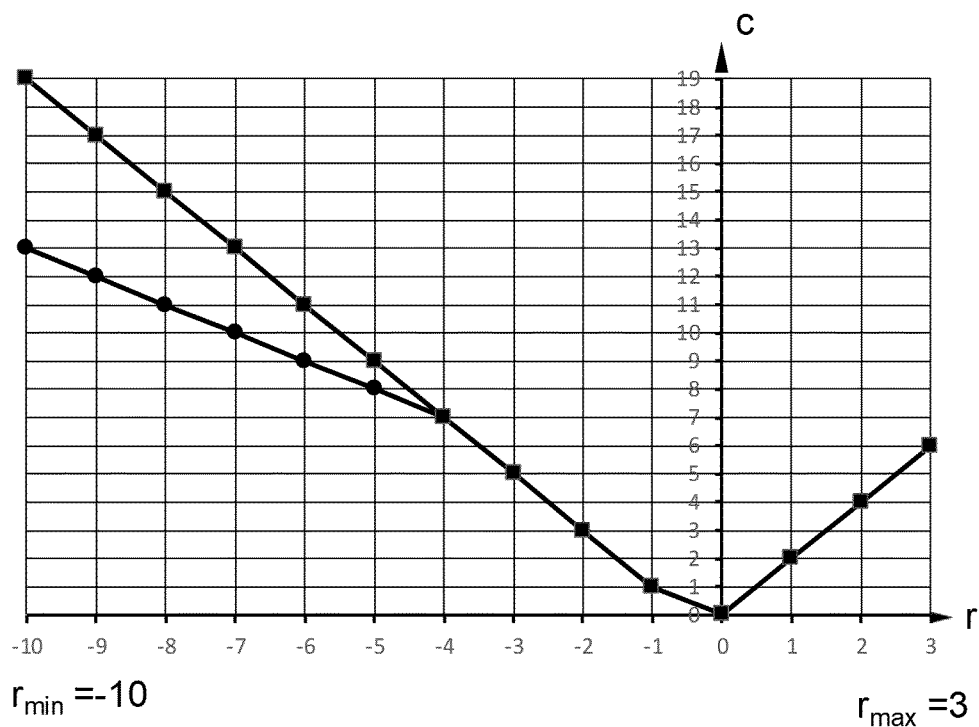
FIGS. 7 and 8 are graphs representing the mapping between the residues and the code, starting by mapping a negative value first and a positive value first, respectively, in a case where $|r_{min}|$ is larger than $r_{max}$.
Figure 8:
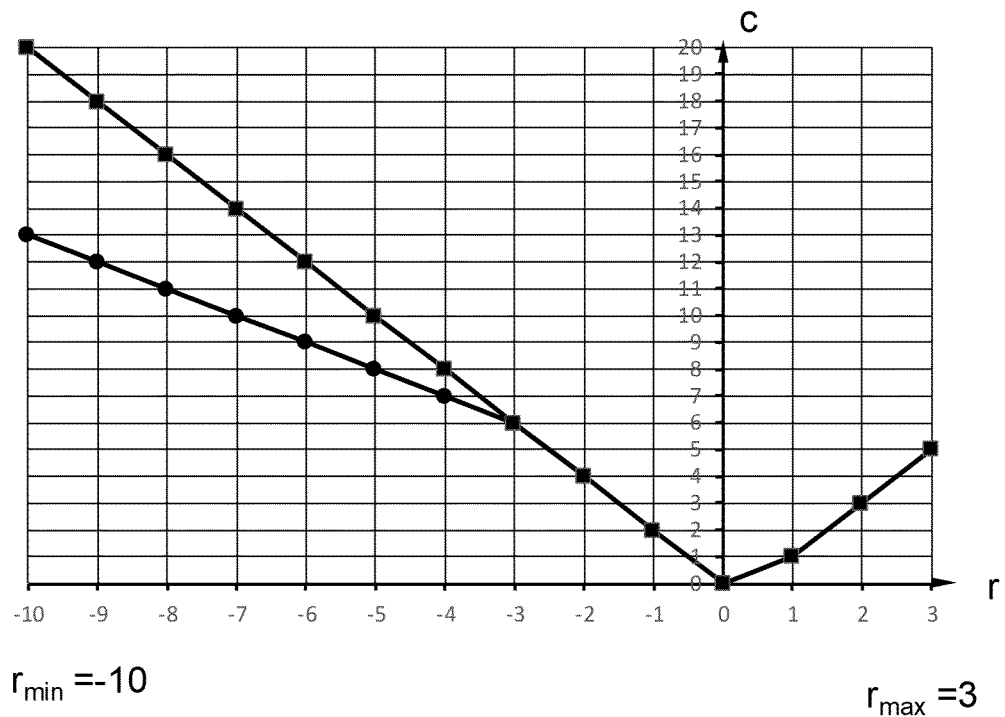

According to the invention, the values of the residues may be mapped to non-negative integers C. This is illustrated on FIGS. 5, 6, 7 and 8. The residues between $r_{min}$ and $r_{max}$ may be mapped to a range of non-negative integers by mapping the value r=0, to C=0, and then mapping r=-1 to C=1, r=1 to C=2, r=-2 to C=3, etc. This is represented by the square markers FIGS. 5 to 8. In FIGS. 5 and 7, the negative value r=-1 is first mapped to C=1 (negative-first mapping). In FIGS. 6 and 8, the positive value r=1 is first mapped to C=1 (positive-first mapping). FIGS. 5 and 6 are graphs representing the situation where m=15, pred=8, and t=4. The value of $r_{max}$ is larger than the absolute value of $r_{min}$. The possible value of GCLI are in the range 0 to 15. In this way, the most probable values of r, i.e. values or r around zero, are mapped to the smallest values of C. C may then be coded efficiently as discussed below. FIGS. 7 and 8 are graphs representing the situation where m=15, pred=12, and t=2.

According to a preferred embodiment of the invention, the mapping of the residues to a non-negative integer C may be improved by taking into account that when $r_{max}$ is larger than $|r_{min}|$ the range of values of C may be reduced by mapping the residues above $r_{min}$ to successive values of C (and not stepping by 2). This is referred to as the "Bounded C" method and represented on FIG. 5 and FIG. 6 by the round markers. The value of C reaches a maximum of 11, instead of a maximum of 14, for the negative-first case (FIG. 5) and instead of a maximum of 13 for the positive-first case (FIG. 6). Similar results may be obtained when $r_{max}$ is smaller than $|r_{min}|$, as illustrated by the round markers on FIGS. 7 and 8: The value of C reaches a maximum of 13, instead of a maximum of 19, for the negative-first case (FIG. 7) and instead of a maximum of 20 for the positive-first case (FIG. 8). Therefore, the maximum value of C is bounded with respect to the value of C without the "Bounded C" method.

In the option "bounded by min", the values of the codes C for the residues comprised between trigger and $r_{max}$, if any, are smaller than without the "Bounded C" method.

In the option "bounded by max", the values of the codes C for the residues comprised between -trigger and $r_{min}$, if any, are smaller than without the "Bounded C" method.

In the option "bounded by min/max", the values of the codes C for the residues comprised between -trigger and $r_{min}$, if any, and the residues comprised between trigger and $r_{max}$, if any, are smaller than without the "Bounded C" method.

The codes C corresponding to a range of residues, according to the negative-first or the positive-first mapping mode, may be obtained by performing the following steps of the mapping algorithm:

We first define the two following parameters:

$C_{first}=-1$ if negative-first, +1 if positive-first

When using the "Bounded C" improvement of the invention, a bounding mode is selected, being one of bounded by min;
  bounded by min/max;
  bounded by max;
  not bounded.

A trigger is determined as follows:

trigger=$|r_{min}|$ if bounded by min, trigger=MIN($|r_{min}|,r_{max}$) if bounded by min/max, trigger=$r_{max}$ if bounded by max.

trigger=m if not bounded.

The code C can then be computed by performing the following steps:

```
IF |r| <= trigger THEN
    IF r*C_first > 0 THEN
        C = 2*|r| − 1
    ELSE  C = 2*|r|
ELSE  C = trigger + |r|
```

Figure 9:
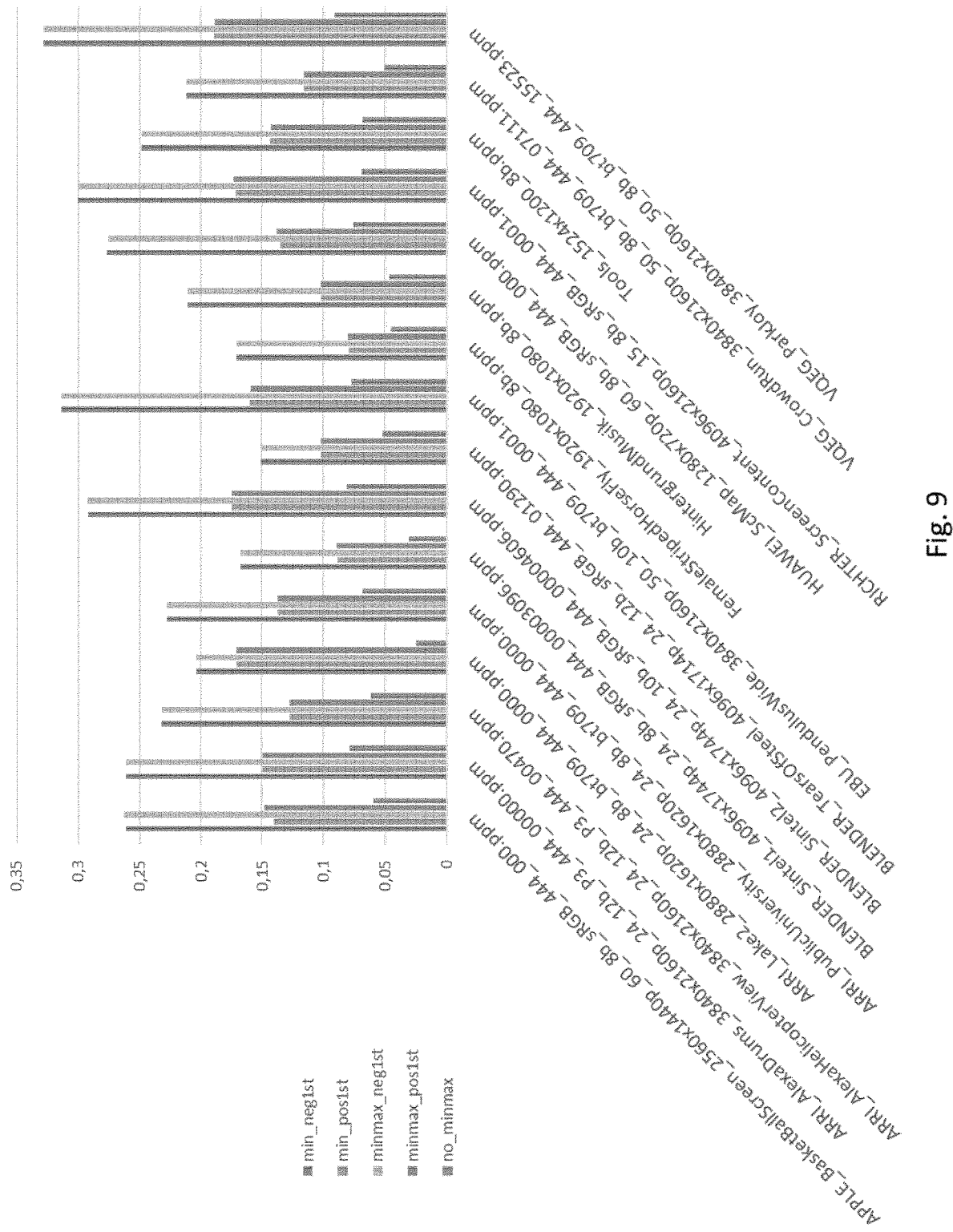
FIG. 9 show the results obtained for different images and different embodiments of the invention.

The option "negative-first" is more interesting since it ensures shorter codes for all values below the predictor, which includes all the values that have been removed by quantization. This is shown in FIG. 9, in which the relative advantage of "negative-first" methods is clearly superior to "positive-first" methods.

The bounding mode "bounded by min/max" does not offer a significant advantage over the bounding mode "bounded by min" bonding method, and thus the method may safely be simplified should its implementation offer a gain by not taking $r_{max}$ into account.

Also, the mapping may be obtained from predetermined lookup tables. The inverse mapping is bijective and thus its inverse may be performed at de the decoder.

Table VI below provides an example of eight successive GCLI's from 1 to 8, for groups of coefficients, coded in m=15 bits. The quantization level is t=4. The initial predictor, for i=1, has been selected as int(m/2), i.e. 7. For each subsequent GCLI, the predictor has been determined as being the previous GCLI. For each successive GCLIs, the residues n have been computed according to equation 2, and the $r_{min}$ and $r_{max}$, have been determined according to equations 6 and 7 respectively. The values of the triggers, according to the different options, have been computed for each GCLI. In the last line, the code C has been in the option "bounded by min", and negative first. Each GCLI is processed independently of the other GCLIs in the input data set, in dependence of the predictor $pred_i$ of the current GCLI.

TABLE VI

| i | 1 | 2 | 3 | 4 | 5 | 6 | 7 | 8 |
|---|---|---|---|---|---|---|---|---|
| $GCLI_i$ | 4 | 3 | 8 | 12 | 5 | 4 | 7 | 4 |
| $pred_i$ | 7 | 4 | 3 | 8 | 12 | 5 | 4 | 7 |
| $r_i$ | −3 | 0 | 4 | 4 | −7 | −1 | 3 | −3 |
| $r_{min}$ | −3 | 0 | 0 | −4 | −8 | −1 | 0 | −3 |
| $r_{max}$ | 8 | 11 | 11 | 7 | 3 | 10 | 11 | 8 |
| Triggers, bounded by | | | | | | | | |
| min | 3 | 0 | 0 | 4 | 8 | 1 | 0 | 3 |
| min/max | 3 | 0 | 0 | 4 | 3 | 1 | 0 | 3 |
| max | 8 | 11 | 11 | 7 | 3 | 10 | 11 | 8 |
| not bounded | 15 | 15 | 15 | 15 | 15 | 15 | 15 | 15 |
| C | 5 | 0 | 4 | 8 | 13 | 1 | 3 | 5 |

Table VII gives the number of bits required for coding the 8 codes C according to the different bounding modes and mapping modes.

TABLE VII

| bounding mode | Negative first | Positive first |
|---|---|---|
| min | 47 | 50 |
| min/max | 44 | 46 |
| max | 51 | 51 |
| not bound | 54 | 55 |

The bold value corresponds to the example shown in table VI. It can be seen that negative first give better results. The "bounded by min/max" bounding mode gives the better results, but the "bounded by min" are also good.

The information that is prepared at the encoder, i.e. the bitplanes and the codes C coding the residues are such that the decoder can from the received codes C, and a reconstructed predictor, determine the number of bit planes $n_{bp}$ to be extracted from the magnitude compressed data set for reconstruction the original quantized data set. The trigger used at the encoder for coding the residue is not needed at the decoder and not transmitted in the meta-data compressed data set.

The decoder receives a value of C and has a value of pred, from the previous step or from pred_init. From these two values, the decoder can compute $r_{min}$ and $r_{max}$, according to equations 6 and 7 respectively. Having a knowledge of the mapping mode and the bounding mode, the decoder computes the trigger. The decoder then may compute the code C corresponding to all values of r between $r_{min}$ and $r_{max}$, according to the above steps of the mapping algorithm. This produces a table giving the correspondence between the values of r between $r_{min}$ and $r_{max}$, and corresponding values of C. The decoder then obtains the value of r as the value corresponding to C in this table.

In an example of table VIII, a code C=5 has been received, with a predictor equal to 7, and a quantization level t=4. The values of $r_{min}$ and $r_{max}$ can be computed and a table for all possible residues between $r_{min}$ and $r_{max}$ built. The code C for each of these 11 values of r is computed and inserted in the table. The value of the received code C=5 is then search in the table for finding the corresponding value of r, r=−3. Other equivalent methods for performing the decoding of the codes C, such as a (binary) search in the table, or a formula.

TABLE VIII

| | $r_i$ | C |
|---|---|---|
| $r_{max}$ | 8 | 11 |
| | 7 | 10 |
| | 6 | 9 |
| | 5 | 8 |
| | 4 | 7 |
| | 3 | 6 |
| | 2 | 4 |
| | 1 | 2 |
| | 0 | 0 |
| | −1 | 1 |
| | −2 | 3 |
| $r_{min}$ | −3 | 5 |

The codes C obtained for the residues in the method of the invention are non-negative integers. If the predictor is an accurate predictor, the residues will be small values. An entropy coding is used for coding C in the meta-data. A preferred entropy coding for C is the Rice coding. Rice coding of a non-negative integer N in dependence of parameter k is as follows:

one divides N by $2^k$ and the resulting quotient is unary coded;

the remainder of the division is binary coded in k bits.

Example values for N between 0 and 10, and k=0, 1 and 2 are given in the table below:

| N | Binary code | Rice code k = 0 | Rice code k = 1 | Rice code k = 2 |
|---|---|---|---|---|
| 0 | 0 | 0 | 0 0 | 0 00 |
| 1 | 1 | 10 | 0 1 | 0 01 |
| 2 | 10 | 110 | 10 0 | 0 10 |
| 3 | 11 | 1110 | 10 1 | 0 11 |
| 4 | 100 | 11110 | 110 0 | 10 00 |
| 5 | 101 | 111110 | 110 1 | 10 01 |
| 6 | 110 | 1111110 | 1110 0 | 10 10 |
| 7 | 111 | 11111110 | 1110 1 | 10 11 |
| 8 | 1000 | 111111110 | 11110 0 | 110 00 |
| 9 | 1001 | 1111111110 | 11110 1 | 110 01 |
| 10 | 1010 | 11111111110 | 111110 0 | 110 10 |

With k=0, the length of the code, for N=0, is one bit. Therefore, the value k=0 is the preferred value for the method of the invention, when the prediction is accurate, and the value 0 is frequent among the residuals to be coded. However, if the accuracy of the prediction is not perfect, larger values of N might occur, and a larger value of k, such a as k=1 or 2, where larger values of N require less bits, may be optimal. Rice coding is a prefix code. Therefore, no code in the set of possible codes is a prefix of another code in the set of possible codes. No special markers are needed between the codes, and the decoder can unambiguously extract successive codes from the meta-data compressed data set.

The quantization step applies the set of $2^m$ values of the magnitudes of the coefficients, between 0 and $2^m-1$, to a set of $2^{m-t}$ values between 0 and $2^{(m-t)}-1$. A simple way to perform this quantization is by removing the t lowest-weight bits of the unquantized coefficients. However, other quantization methods may be used in the invention.

FIG. 9 show the results obtained for different images and different embodiments of the invention. For each of 16 test images, the bar graphs show the PSNR (Peak Signal to Noise Ratio) with respect to a method where the encoding of the invention is not used, but where residues are coded using unary encoding, such as in document SMPTE RDD 35:2016. The bar graphs represent successively
the case where only the $|r_{min}|$ bound is used, with the negative-first mapping mode (min_neg1st);
the case where only the $|r_{min}|$ bound is used, with the positive-first mapping mode (min_pos1st);
the case where both $|r_{min}|$ and $r_{max}$ bounds are used, with the negative-first mapping mode (minmax_neg1st);
the case where both $|r_{min}|$ and $r_{max}$ bounds are used, with the positive-first mapping mode (minmax_pos1st).
the case where neither $|_{min}|$ nor $r_{max}$ bounds are used, with the negative-first mapping mode (no_minmax).
These results show that using both $|r_{min}|$ and $r_{max}$ bounds provides a very small improvement with respect to using only the $|r_{min}|$ bound. In both cases using the negative-first mapping mode is significantly better than using the positive-first mapping mode.

The present description addresses the processing of the magnitudes of the coefficients. The methods apply to unsigned coefficients. The methods apply as well when the input data comprise signed coefficients. These signed coefficients may be coded as sign+magnitude or transformed to sign+magnitude format. The sign bits of the coefficients of a group are grouped as a sign bit plane, and the sign bit plane is processed along with the magnitude bit planes. The invention relates to a method for compressing an input data set, wherein the coefficients in the input data set are grouped in groups of coefficients, a number of bit planes, GCLI, needed for representing each group is determined, a quantization is applied, keeping a limited number of bit planes, a prediction mechanism is applied to the GCLIs for obtaining residues, and an entropy encoding of the residues is performed. The entropy-encoded residues, and the bit planes kept allow the decoder to reconstruct the quantized data, at a minimal cost in meta-data.

The invention claimed is:
1. A method for compressing an input data set into a corresponding compressed data set, the compressed data set comprising a magnitude compressed data set and a meta-data compressed data set, the method comprising:
receiving the input data set, where the input data set comprises a sequence of M coefficients, each coefficient having m bits coding a magnitude between 0 and $2^m-1$;
determining compression parameters;
grouping the coefficients into one or more successive groups of n coefficients, a grouping factor n being greater than or equal to 2, each group of coefficients having m magnitude bit planes for different weights of the coefficients;
for each group i of coefficients:
determining a value of a Greatest Coded Line Index (GCLI), with $GCLI_i$ being an index of a highest weight non-zero bit among bits of a magnitude of the coefficients in group i, the index being counted from 1 for a least significant bit to m for a most significant bit, the GCLI being zero for a group wherein all of the coefficients are equal to zero;
performing a quantization such that quantized coefficients are in a range 0 to $2^{(m-t)}-1$, providing n quantized coefficients, t being a quantization level;
if $GCLI_i \geq t+1$, for each bit plane of the group, then copying bit planes having weight 1 to weight $GCLI_i-t$ of the quantized coefficients to the magnitude compressed data set;
computing a predictor, $pred_i$, of $GCLI_i$, in function of the GCLIs of one or more groups of antecedent coefficients in the sequence of coefficients, the predictor $pred_i$ being equal to pred_init, for a first group of coefficients of the sequence of coefficients;
computing a residue $r_i$ according to

$$r_i = \max(GCLI_i-t, 0) - \max(pred_i-t, 0);$$

mapping the residue $r_1$ to a code C;
providing an entropy encoding of the code C; and
copying the encoding into the meta-data compressed data set.

2. The method according to claim 1, wherein the entropy encoding is a Rice coding, with k=0, 1 or 2.

3. The method according to claim 1, wherein n is smaller than or equal to 8.

4. The method according to claim 1, wherein the quantization is performed by removing t lowest bit planes of the groups of coefficients.

5. The method according to claim 1, wherein the input data set is obtained by performing a decorrelative transform on a non-decorrelated input data set.

6. The method according to claim 1, wherein the sequence of M coefficients corresponds to:
a sequence of pixels of one or more rows of a display image comprising rows and columns of pixels; or one or more rows of a subband of a decorrelative transform of a display image comprising rows and columns of pixels.

7. The method according claim 6, wherein when computing the predictor $pred_i$ of $GCLI_i$ when a prediction mode is vertical prediction mode, the predictor $pred_i$ is:
the GCLI of a group of pixels in a same column of a previous row of pixels if the GCLI is larger than t,
zero if the GCLI is smaller than or equal to t, or
pred_init for the groups of pixels of the first row of pixels.

8. The method according to claim 7, wherein:
the input data set comprises a first input data set having a quantization level $t_1$, a second input data set having a quantization level $t_2$, the last row of pixels of the first input data set being above the first row of pixels of the second input data set, in a display image, and
a predictor for a group of pixels of a first row of pixels of the second input data set is equal to:
a GCLI of a group of pixels of a last row of pixels in a same column of the first input data set if the GCLI>$t_1$; and
equal to zero if the GCLI≤$t_1$.

9. The method according to claim 1, wherein when computing the predictor $pred_i$ of $GCLI_i$ when a prediction mode is horizontal prediction mode, the predictor $pred_i$ is:
the GCLI of a previous group of coefficients in the sequence of coefficients, or pred_init for the first group of coefficients in the sequence of coefficients.

10. The method of claim 1, further comprising a decompression of the compressed data sets into decompressed data sets each comprising a sequence of coefficients, each coefficient having m bits coding a magnitude, wherein the decompression comprises:
initializing a predictor $pred_i'$ to pred_init;
initializing a row of GCLIs $prev_i$ to pred_init if the prediction mode is vertical;
extracting a code $c_i$ from the meta-data compressed data set; and
iteratively, for each code and bit plane until all codes in the meta-data compressed data set have been processed:
computing, if the prediction mode is vertical, $pred_i'=prev_i$;

obtaining a residue $r_i$ corresponding to the code $c_i$ from a table comprising values of r between $r_{min}$ and $r_{max}$ and corresponding values of code c;
computing a number of bit planes $n_{bp}$ stored for a group corresponding to the code—according to $n_{bp}=r_i+pred_i'$;

providing, if the number of bit planes $n_{bp}$ equals zero, a sequence of n m-bit words having all bit planes from t+1 to m at zero in the decompressed data set;
providing, if the number of bit planes $n_{bp}$ is different from zero, a sequence of n m-bit words having t+1 to t+$n_{bp}$ bit planes extracted from subsequent n-bit bit planes from the magnitude compressed data set and having t+1+$n_{bp}$ to m bit planes equal to zero;
replacing, if the prediction mode is horizontal, $pred_i'$ by $n_{bp}$; and
replacing, if the prediction mode is vertical, $prev_i=n_{bp}$.

11. The method according to claim 10, further comprising, for the first row of the second data set, setting the predictor $pred_i'$ to the corresponding value of $prev_i$ obtained for a last row of the first data set.

12. The method according to claim 1 wherein pred_init is equal to zero or equal to int(m/2).

13. The method according to claim 1, wherein the compression parameters comprise at least one of:
a value of M;
a value of m;
a value of n;
a value of t;
a type of quantization;
a mapping mode, being either negative-first or positive-first;
a number of rows and a number of columns of a display image, if the input data set represents the display image;
a number of rows of a subband, if the sequence of pixels is a decorrelative transform of the display image;
a prediction mode, that is a horizontal or vertical prediction;
a way initial values of predictors are determined;
an entropy coding mode;
a value of a parameter k of a Rice coding if the entropy coding mode is Rice coding; or
a bounding mode being one of "bounded by min", "bounded by min/max", "bounded by max", and "not bounded".

14. The method according to claim 13, wherein the mapping is obtained by:
computing a smallest value of the residues $r_{min}$ for all possible values of $GCLI_i$, according to $r_{min}=-\max(pred_i-t,0)$;

computing a largest value of the residues $r_{max}$ for all possible values of $GCLI_i$, according to $r_{max}=\max(m-\max(pred_i,t),0)$;

computing $C_{first}=-1$ if the mapping mode is negative-first, $C_{first}=+1$ if the mapping mode is positive-first;

computing trigger=$|r_{min}|$ if a bounding mode is "bounded by min";

trigger=MIN($|r_{min}|,r_{max}$) if the bounding mode is "bounded by min/max";

trigger=$r_{max}$ if the bounding mode is "bounded by max";

trigger=m if the bounding mode is "not bounded"; and computing $C=2*|r_i|-1$ if $|r_i|<=$trigger and $r_i*C_{first}>0$;

$C=2*|r_i|$ if $|r_i|<=$trigger and $ri*C_{first}<0$; and $C=$trigger+$|r_i|$ if $|r_i|>$trigger.

15. A compression system, comprising:
a processor; and
a memory device storing instructions executable by the processor to perform operations for compressing one or more input data sets into one or more corresponding compressed data sets, each compressed data set comprising a magnitude compressed data set and a meta-data compressed data set, the operations comprising:

receiving one or more input data sets, each input data set comprising a sequence of M coefficients, each coefficient having m bits coding a magnitude between 0 and $2^m-1$;

determining compression parameters;

grouping the coefficients into one or more successive groups of n coefficients, a grouping factor n being greater than or equal to 2, each group of coefficients having m magnitude bit planes for different weights of the coefficients;

for each group i of coefficients:

determining a value of a Greatest Coded Line Index (GCLI), with GCLI being an index of a highest weight non-zero bit among bits of a magnitude of the coefficients in group i, the index being counted from 1 for a least significant bit to m for a most significant bit, the GCLI being zero for a group wherein all of the coefficients are equal to zero;

performing a quantization such that quantized coefficients are in a range 0 to $2^{(m-t)}-1$, providing n quantized coefficients, t being a quantization level;

if $GCLI_i \geq t+1$, for each bit plane of the group, copying bit planes having weight 1 to weight $GCLI_i-t$ of the quantized coefficients to the magnitude compressed data set;

computing a predictor, $pred_i$, of $GCLI_i$, in function of the GCLIs of one or more groups of antecedent coefficients in the sequence of coefficients, the predictor $pred_i$ being equal to pred_init, for a first group of coefficients of the sequence of coefficients;

computing a residue $r_i$ according to $r_i = \max(GCLI_i - t, 0) - \max(pred_i - t, 0)$;

mapping the residue $r_i$ to a code C;

providing an entropy encoding of the code C; and copying the encoding into the meta-data compressed data set.

16. The system according to claim 15, wherein the compression parameters comprise at least one of:
a value of M;
a value of m;
a value of n;
a value of t;
a type of quantization;
a mapping mode, being either negative-first or positive-first;
a number of rows and a number of columns of a display image, if the input data set represents the display image;
a number of rows of a subband, if the sequence of pixels is a decorrelative transform of the display image;
a prediction mode, that is a horizontal or vertical prediction;
a way initial values of predictors are determined;
an entropy coding mode;
a value of a parameter k of a Rice coding if the entropy coding mode is Rice coding; or
a bounding mode being one of "bounded by min", "bounded by min/max", "bounded by max", and "not bounded".

17. The method according to claim 16, wherein the mapping is obtained by:

computing a smallest value of the residues $r_{min}$ for all possible values of $GCLI_i$ according to $r_{min} = -\max(pred_1 - t, 0)$;

computing a largest value of the residues $r_{max}$ for all possible values of $GCLI_i$ according to $r_{max} = \max(m - \max(pred_i, t), 0)$;

computing $C_{first} = -1$ if the mapping mode is negative-first, $C_{first} = +1$ if the mapping mode is positive-first;

computing trigger = $|r_{min}|$ if a bounding mode is "bounded by min";

trigger = $\min(|r_{min}|, r_{max})$ if the bounding mode is "bounded by min/max";

trigger = $r_{max}$ if the bounding mode is "bounded by max";

trigger = m if the bounding mode is "not bounded"; and computing $C = 2*|r_i| - 1$ if $|r_i| \leq$ trigger and $r_i * C_{first} > 0$;

$C = 2*|r_i|$ if $|r_i| \leq$ trigger and $r_i * C_{first} < 0$; and $C = $ trigger $+ |r_i|$ if $|r_i| >$ trigger.

18. The system according to claim 15, wherein the entropy encoding is a Rice coding, with k=0, 1 or 2.

19. The system according to claim 15, wherein n is smaller than or equal to 8.

20. A decompression system, comprising:
a processor; and
a memory device storing instructions executable by the processor to perform operations for decompressing a compressed data set into a decompressed data set, the operations comprising:

receiving a meta-data compressed data set comprising a sequence of entropy encoded codes $c_i$ and a magnitude compressed data set comprising bit planes of coefficients;

initializing a predictor $pred_i'$ to pred_init;

initializing a row of Greatest Coded Line Indexes (GCLIs) $prev_i$ to pred_init if a prediction mode is vertical;

extracting a code $c_i$ from the meta-data compressed data set; and iteratively, for each code and bit plane until all codes in the meta-data compressed data set have been processed:

computing, if the prediction mode is vertical, $pred_i' = prev_i$;

obtaining a residue $r_i$ corresponding to the code $c_i$ from a table comprising values of r between $r_{in}$ and $r_{max}$ and corresponding values of code c;

computing a number of bit planes $n_{bp}$ stored for a group corresponding to the code according to $n_{bp} = r_i + pred_i'$;

providing, if a number of bit planes $n_{bp}$ equals zero, a sequence of n m-bit words having all bit planes from t+1 to m at zero in the decompressed data set;

providing, if the number of bit planes $n_{bp}$ is different from zero, a sequence of n m-bit words having t+1 to t+$n_{bp}$ bit planes extracted from subsequent n-bit bit planes from the magnitude compressed data set and having t+1+$n_{bp}$ to m bit planes equal to zero;

replacing, if the prediction mode is horizontal, $pred_i'$ by $n_{bp}$; and replacing, if the prediction mode is vertical, $prev_i = n_{bp}$.

\* \* \* \* \*

UNITED STATES PATENT AND TRADEMARK OFFICE
CERTIFICATE OF CORRECTION

PATENT NO. : 11,475,600 B2  
APPLICATION NO. : 16/629145  
DATED : October 18, 2022  
INVENTOR(S) : Pascal Hubert Pellegrin et al.

Page 1 of 1

It is certified that error appears in the above-identified patent and that said Letters Patent is hereby corrected as shown below:

On the Title Page

Item (30), under "Foreign Application Priority Data," "17180619" should read --17180619.3--.

In the Claims

Claim 1, Column 14, Line 29, "with $GCLI_1$ being" should read --with $GCLI_i$ being--.

Claim 1, Column 14, Line 50, "mapping the residue $r_1$" should read --mapping the residue $r_i$--.

Claim 14, Column 16, Line 31, "$r_{min}$=−max($pred_1$–$t$,0);" should read --$r_{min}$=−max($pred_i$–$t$,0);--.

Claim 15, Column 17, Line 13, "with GCLI" should read --with $GCLI_i$--.

Claim 15, Column 17, Line 23, "weight 1 to weight $GCLI_1$–t" should read --weight 1 to weight $GCLI_i$–t--.

Claim 15, Column 17, Line 67, "$r_{min}$=−max($pred_1$–t,0);" should read --$r_{min}$=−max($pred_i$–$t$,0);--.

Claim 20, Column 18, Line 55, "$r_{in}$" should read --$r_{min}$--.

Signed and Sealed this  
Twenty-eighth Day of February, 2023

Katherine Kelly Vidal  
*Director of the United States Patent and Trademark Office*